(12) United States Patent
Yoon et al.

(10) Patent No.: US 11,515,193 B2
(45) Date of Patent: Nov. 29, 2022

(54) ETCHING APPARATUS

(71) Applicant: Samsung Electronics Co., Ltd., Suwon-si (KR)

(72) Inventors: Kuihyun Yoon, Yongin-si (KR); Jaehak Lee, Incheon (KR); Yunhwan Kim, Hwaseong-si (KR); Jongkeun Lee, Yongin-si (KR); Kyohyeok Kim, Seoul (KR); Jewoo Han, Hwaseong-si (KR)

(73) Assignee: Samsung Electronics Co., Ltd.

( * ) Notice: Subject to any disclaimer, the term of this patent is extended or adjusted under 35 U.S.C. 154(b) by 211 days.

(21) Appl. No.: 16/901,228

(22) Filed: Jun. 15, 2020

(65) Prior Publication Data

US 2021/0111056 A1    Apr. 15, 2021

(30) Foreign Application Priority Data

Oct. 15, 2019    (KR) .................. 10-2019-0127898

(51) Int. Cl.
*H01J 37/32*    (2006.01)
*H01L 21/683*    (2006.01)
*H01L 21/687*    (2006.01)
*H01L 21/67*    (2006.01)

(52) U.S. Cl.
CPC .... *H01L 21/6833* (2013.01); *H01J 37/32513* (2013.01); *H01J 37/32642* (2013.01); *H01L 21/67063* (2013.01); *H01L 21/68757* (2013.01)

(58) Field of Classification Search
CPC ............. G16H 50/20; H01J 37/32513; H01J 37/32642; H01L 21/67063; H01L 21/67109; H01L 21/67126; H01L 21/6831; H01L 21/6833; H01L 21/68735; H01L 21/68757; H01L 21/67069; H01L 21/67098; H01L 21/68721
USPC .............. 156/345.14, 345.3, 345.37, 345.47, 156/345.51, 345.53
See application file for complete search history.

(56) References Cited

U.S. PATENT DOCUMENTS

| | | | |
|---|---|---|---|
| 6,004,450 | A | 12/1999 | Northrup et al. |
| 6,475,336 | B1 | 11/2002 | Hubacek |
| 6,676,804 | B1 | 1/2004 | Koshimizu et al. |
| 8,021,488 | B2 | 9/2011 | Tanaka |
| 10,153,138 | B2 | 12/2018 | Aoto et al. |

(Continued)

FOREIGN PATENT DOCUMENTS

| | | |
|---|---|---|
| JP | 5227197 | 3/2013 |
| KR | 100426149 | 4/2004 |
| KR | 1020050011862 | 1/2005 |

*Primary Examiner* — Lan Vinh
(74) *Attorney, Agent, or Firm* — Myers Bigel, P.A.

(57) ABSTRACT

An etching apparatus includes a reaction chamber having an internal space; an upper electrode in the reaction chamber; a fixing chuck in the internal space of the reaction chamber and below the upper electrode; an electrostatic chuck above the fixing chuck and on which a wafer is configured to be placed; a focus ring surrounding the electrostatic chuck; and a plurality of sealing members configured to seal cooling gas provided to the focus ring and being in contact with the focus ring. The plurality of sealing members may be formed of a porous material. Each of the plurality of sealing members may include a body portion and an outer surface surrounding the body portion. Only the body portion may include voids and the outer surface may be smooth and free of voids.

20 Claims, 7 Drawing Sheets

(56) References Cited

U.S. PATENT DOCUMENTS

| | | |
|---|---|---|
| 10,391,526 B2 * | 8/2019 | Avoyan .................. B08B 17/04 |
| 2005/0018377 A1 | 1/2005 | Cho et al. |
| 2010/0140222 A1 | 6/2010 | Sun et al. |
| 2011/0000883 A1 | 1/2011 | Endoh et al. |
| 2014/0202618 A1 * | 7/2014 | Hayashi ................. H02N 13/00 |
| | | 156/499 |
| 2015/0053348 A1 * | 2/2015 | Nagayama .......... H01J 37/3266 |
| | | 118/723 R |
| 2015/0187614 A1 | 7/2015 | Gaff et al. |
| 2018/0166312 A1 | 6/2018 | Kimball et al. |

* cited by examiner

ETCHING APPARATUS

CROSS-REFERENCE TO RELATED APPLICATION(S)

This application claims the benefit of and priority to Korean Patent Application No. 10-2019-0127898 filed on Oct. 15, 2019 in the Korean Intellectual Property Office, the disclosure of which is incorporated by reference herein in its entirety.

BACKGROUND

The present inventive concept relates to an etching apparatus.

As a level of difficulty of processing increases in a semiconductor etching apparatus, gradually higher levels of RF power are applied, thereby increasing a temperature of a focus ring. In this case, the temperature of the focus ring generates a temperature deviation up to about 300° C. depending on process conditions.

Thus, cooling gas is supplied in order to suppress an increase in the temperature of the focus ring. However, there is a problem that a gap occurs in a space between an O-ring and the focus ring or a fixing chuck due to thermal expansion of the O-ring so that the cooling gas is only supplied to the focus ring.

Accordingly, there is a problem that discharge may occur.

SUMMARY

An aspect of the present inventive concept is to provide an etching apparatus capable of preventing a gap of a space between an O-ring and a focus ring or a fixing chuck from occurring.

In addition, an aspect of the present inventive concept is to provide an etching process capable of preventing a discharge from occurring.

According to an aspect of the present inventive concept, an etching apparatus includes a reaction chamber having an internal space, an upper electrode in the reaction chamber, a fixing chuck in the internal space of the reaction chamber and below the upper electrode, an electrostatic chuck above the fixing chuck and on which a wafer is configured to be placed, a focus ring surrounding the electrostatic chuck, and a plurality of sealing members configured to seal cooling gas provided to the focus ring and being in contact with the focus ring. The plurality of sealing member may be formed of a porous material. Each of the plurality of sealing members may include a body portion and an outer surface surrounding the body portion, and only the body portion may include voids and the outer surface may be smooth and free of voids.

According to an aspect of the present inventive concept, an etching apparatus includes a reaction chamber having an internal space, an upper electrode in the reaction chamber, a fixing chuck in the internal space of the reaction chamber and below the upper electrode, an electrostatic chuck above the fixing chuck and on which a wafer is configured to be placed, and a focus ring surrounding the electrostatic chuck. The electrostatic chuck may include a stepped side surface, and a coating layer may be on an outer surface of the electrostatic chuck. The focus ring may include a groove portion such that an inner surface of the focus ring is stepped, with the groove portion opposite the side surface of the electrostatic chuck. The etching apparatus may further include a ring member in the groove portion.

According to an aspect of the present inventive concept, an etching apparatus includes a reaction chamber having an internal space, an upper electrode in the reaction chamber, a fixing chuck in the internal space of the reaction chamber and below the upper electrode, an electrostatic chuck above the fixing chuck and on which a wafer is configured to be placed, a focus ring surrounding the electrostatic chuck, and including a groove portion in a lower portion of an inner surface thereof and an insertion groove on a bottom surface thereof, a ring member fixedly installed in the groove portion of the focus ring, and a sealing member received in the insertion groove. The sealing member may be formed of a porous material and include a body portion and an outer surface surrounding the body portion, and only the body portion may include voids and the outer surface may be smooth and free of voids.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, preferred example embodiments of the present inventive concept will be described with reference to the accompanying drawings.

Figure 1:
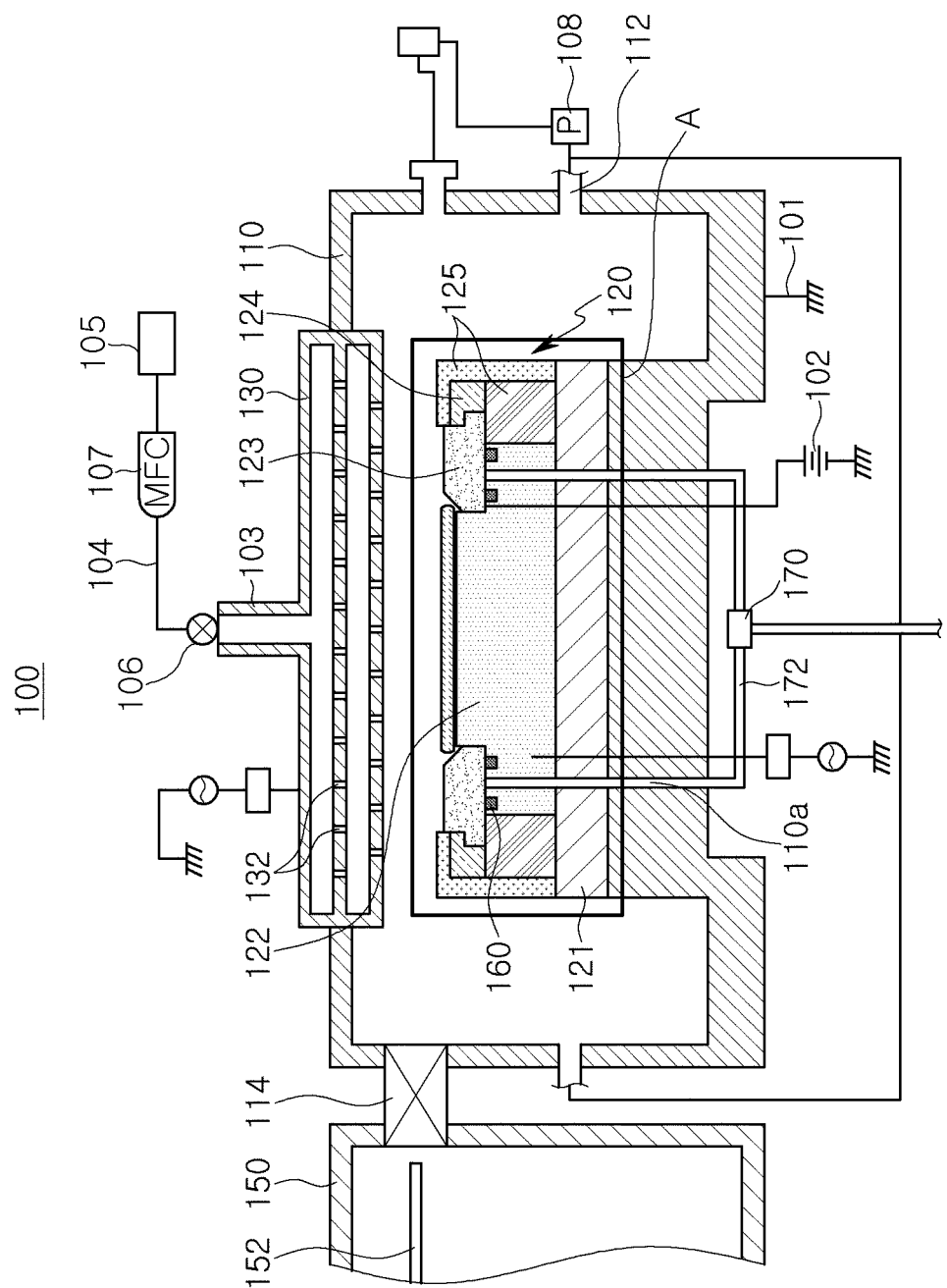
FIG. 1 is a configuration diagram illustrating an etching apparatus according to example embodiments.

FIG. 1 is a configuration diagram illustrating an etching apparatus according to example embodiments.

Referring to FIG. 1, an etching apparatus 100 may include a reaction chamber 110 in which a wafer is loaded. The reaction chamber 110 may provide or define a space for performing an etching process on the loaded wafer, and may include a susceptor 120 having an electrostatic chuck 122 on which the wafer is placed, and an upper electrode 130 disposed above the susceptor 120. Each of the susceptor 120 and the upper electrode 130 may have a substantially cylindrical shape, and the reaction chamber 110 may be grounded via a ground line 101.

Meanwhile, the electrostatic chuck 122 may be disposed in the upper portion of the susceptor 120 to fix the wafer. The electrostatic chuck 122 may include two polyimide-based films and a conductive thin film disposed therebetween. The conductive thin film may be connected to a high-voltage direct current (DC) power supply 102 disposed outside of the reaction chamber 110.

When a predetermined voltage is applied to the conductive thin film from the high-voltage direct current (DC) power supply 102, electric charges may be generated on surfaces of the polyimide-based films, to generate Coulomb force for fixing the wafer to an upper surface of the electrostatic chuck 122. However, a method of fixing the wafer is not limited to a method using the electrostatic chuck, and a method of fixing the wafer using a mechanical device, such as a clamp, may be used.

The upper electrode 130 may be disposed to face the susceptor 120 in an upper portion of the electrostatic chuck 122. A lower end portion of the upper electrode 130 may be formed of silicon to stabilize at atmosphere inside the reaction chamber 110 during the etching process. The silicon may be of a thickness such that high frequency power used for a plasma etching process is sufficiently transmitted. In addition, the upper electrode 130 may include components or materials such as aluminum, anodized aluminum, and the like.

A gas inlet 103 for supplying gases supplied for the etching process may be disposed in or at an upper portion of the upper electrode 130. The gas inlet 103 may be connected to a reaction gas supply source 105 through a gas supply line 104, and a valve 106 and a mass flow controller (WC) 107 for controlling a flow rate may be disposed on or in the gas supply line 104. In this case, the upper electrode 130 may be a path for supplying reaction gas into the reaction chamber 110. To this end, the upper electrode 130 may be comprised of a plurality of layers having a plurality of diffusion holes 132. The lower end portion of the upper electrode 130 may have a shower head structure or a hollow structure for uniform distribution of gas.

The reaction chamber 110 may be connected to a predetermined decompression device 108 (for example, a vacuum pump) through an exhaust pipe 112 disposed in a predetermined region. Accordingly, the reaction chamber 110 may provide low internal pressure, required for excellent etching characteristics. A gate valve 114 may be disposed on a side wall of the reaction chamber 110, and a load lock chamber 150 having a wafer transfer arm 152 disposed therein may be connected to the gate valve 114.

Meanwhile, in an operation of transferring the wafer to the reaction chamber 110, a pressure of the load lock chamber 150 may be reduced to a level similar to a pressure of the reaction chamber 110, and then the wafer transfer arm 152 may be used to transfer the wafer from the load lock chamber 150 to the reaction chamber 110. Then, the wafer transfer arm 152 may be transferred from the reaction chamber 110 to the load lock chamber 150, and then the gate valve 114 may be closed.

In addition, a detailed description of a fixing chuck 121, an electrostatic chuck 122, a focus ring 123, an insulating ring 125, a sealing member 160, and a pressure adjustment unit 170 of the susceptor 120 will be described below.

Figure 2:
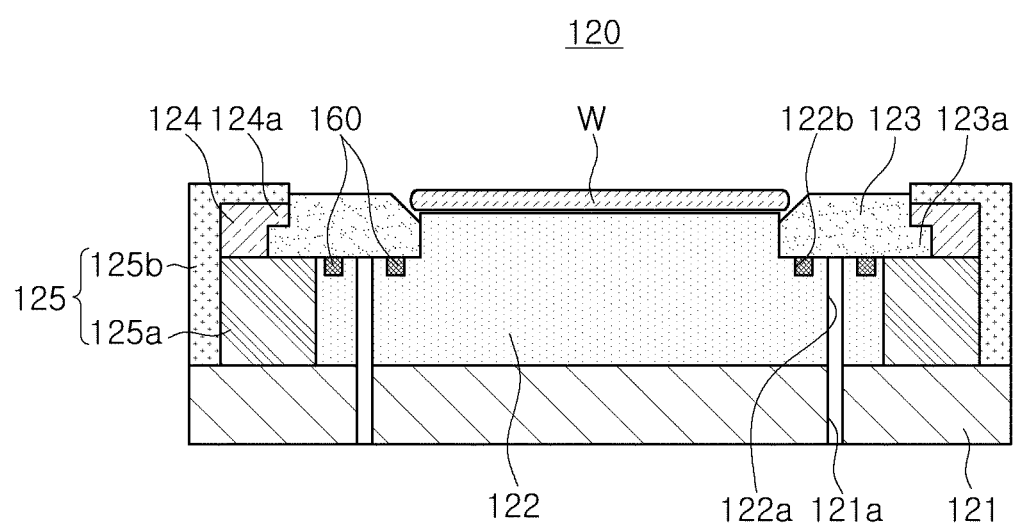
FIG. 2 is an enlarged view illustrating portion A of FIG. 1.

FIG. 2 is an enlarged view illustrating portion A of FIG. 1.

Referring to FIGS. 1 and 2, the electrostatic chuck 122 may be installed on an upper surface of the fixing chuck 121. Meanwhile, the fixing chuck 121 may be formed of a conductive material having excellent electrical conductivity such as aluminum (Al), and may have a disk shape having a diameter larger than that of the electrostatic chuck 122. The fixing chuck 121 may be provided with a first flow path 121a through which cooling gas in which pressure is adjusted by the pressure adjustment unit 170 flows. Meanwhile, the first flow path 121a may be connected to a flow path portion 110a (see FIG. 1) formed in the reaction chamber 110 (see FIG. 1).

The electrostatic chuck 122 may be fixedly installed on the upper surface of the fixing chuck 121 as described above. For example, the electrostatic chuck 122 may be in the form of a circular plate comprised of an insulating material such as a ceramic material. As described above, the electrostatic chuck 122 may include two polyimide-based films and a conductive thin film disposed therebetween. The conductive thin film may be connected to the high-voltage DC power supply 102 (see FIG. 1) disposed outside of the reaction chamber 110. When a predetermined voltage is applied to the conductive thin film from the high-voltage DC power supply 102, electric charges may be generated on surfaces of the polyimide-based films, to generate a coulomb force for fixing the wafer W to an upper surface of the electrostatic chuck 122. Accordingly, the wafer W, loaded in the reaction chamber 110 may be placed on lift pins (not shown).

Meanwhile, the electrostatic chuck 122 may be provided with a second flow path 122a connected to the first flow path 121a and through which cooling gas flows to provide the cooling gas to the focus ring 123. The electrostatic chuck 122 may be provided with an insertion groove 122b disposed below the focus ring 123 and into which the sealing member 160 is inserted. The insertion groove 122b may have a rectangular cross-section as an example. Meanwhile, the insertion groove 122b may have a circular ring shape, and two thereof may be spaced apart in a radial direction. The second flow path 122a of the electrostatic chuck 122 may be open toward or at the focus ring 123 between two insertion grooves 122b.

The focus ring 123 may be disposed to surround an upper end portion or upper outer or side portion of the electrostatic chuck 122. For example, the focus ring 123 may have a circular ring shape. The focus ring 123 may be formed of a conductive material such as a metal. Meanwhile, the focus ring 123 may perform to move active ions and radicals of source plasma to a peripheral portion of the wafer W, to improve uniformity of a plasma sheath formed on the wafer W. Accordingly, the source plasma formed in the internal space of the process chamber 110 (see FIG. 1) may be formed intensively in an upper region of the wafer W.

Meanwhile, the focus ring 123 may be formed of any one of silicon (Si), silicon carbides (SiC), silicon oxides ($SiO_2$), and aluminum oxide ($Al_2O_3$).

For example, a protrusion 123a may be provided on an outer circumferential surface or outer circumferential portion of the focus ring 123 to be fixed by the fixing ring 124.

The fixing ring 124 may be fixedly installed on the outer circumferential surface of the focus ring 123, and may have a corresponding protrusion part 124a corresponding to the protrusion 123a of the focus ring 123 at an upper end portion thereof. As described above, the corresponding protrusion part 124a of the fixing ring 124 may be disposed above the protrusion 123a of the focus ring 123 to prevent the focus ring 123 from being separated from the electrostatic chuck 122.

The insulating ring 125 may include a first insulating ring 125a disposed on an outer surface or outer side surface of the electrostatic chuck 122, and a second insulating ring 125b disposed to surround the outer circumferential surface or outer side surface of the first insulating ring 125a and the outer circumferential surface or outer side surface and the upper surface of the fixing ring 124. The insulating ring 125 serves to insulate the electrostatic chuck 122 and the fixing ring 124. Meanwhile, in the present example embodiment, a configuration in which the insulating ring 125 is comprised of two insulating rings is illustrated as an example, but the number of the insulating rings 125 may be variously changed. For example, the insulating ring 125 may consist of three insulating rings.

Meanwhile, as an example, the fixing ring 124 may be fixedly installed to the first insulating ring 125*a*.

Figure 3:
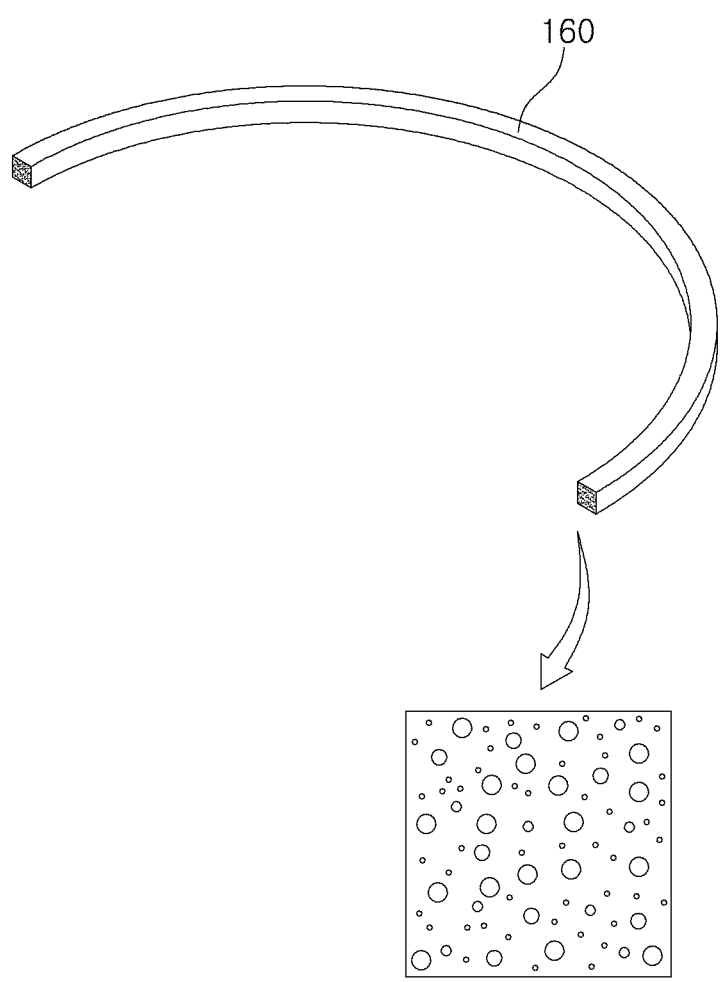
FIG. 3 is a cutaway perspective view illustrating a portion of a sealing member.

The sealing member 160 is insertedly disposed into the insertion groove 122*b* of the electrostatic chuck 122. The sealing member 160 may serve to prevent cooling gas provided to the focus ring 123 from entering an internal space of a vacuum chamber 110. Meanwhile, as shown in FIG. 3, the sealing member 160 may have voids formed only therein. In other words, the sealing member 160 is formed of a porous material, but no voids are formed or present on the outer surface of the sealing member 160. That is, the outer surface of the sealing member 160 may be formed to be smooth. For example, the sealing member 160 may include a body portion and an outer surface surrounding the body portion, and only the body portion may include voids and the outer surface may be smooth and free of voids. In addition, the sealing member 160 may have a value of Shore A hardness of 15 to 50.

As described above, since the sealing member 160 is formed of a porous material having voids formed only therein, and has a value of Shore A hardness of 15 to 50, it is possible to suppress deformation of an exterior of the sealing member 160 even if a temperature of the focus ring 123 increased. Therefore, since a gap may not occur between the focus ring 123 and the electrostatic chuck 122 by the deformation of the sealing member 160, the etching process may be easily performed.

Meanwhile, the sealing member 160 may have a filling rate or fill amount of 90% or more in the insertion groove 122*b* (e.g., the sealing member 160 may fill 90% or more of a volume of the insertion groove 122*b*).

With regard thereto, in more detail, the temperature deviation of the focus ring 123 during the etching process is generated up to about 300° C. depending on the process conditions. Meanwhile, the conventional sealing member is formed of an elastic material having a value of Shore A hardness of 60 or more. In this case, in the prior art, a sealing member, in contact with the focus ring 123 is expanded. Accordingly, while a gap is formed between the focus ring 123 and the electrostatic chuck 122, cooling gas is supplied between the focus ring 123 and the electrostatic chuck 122. In this situation, when the etching process is performed, a potential difference between the electrostatic chuck 122 and the focus ring 123 is generated, and the cooling gas causes discharge even in a very small space by this potential difference. As such, there is a problem that discharge may occur during the etching process.

However, since the sealing member 160 is formed of a porous material having only voids formed therein, and has a value of Shore A hardness of 15 to 50, discharges may be prevented from occurring. In other words, since the voids are only formed in the sealing member 160, the outer shape of the sealing member 160 may not be deformed, even when the temperature of the focus ring 123 increases. Accordingly, it is possible to suppress the formation of a gap between the focus ring 123 and the electrostatic chuck 122. Therefore, it is possible to prevent discharges from occurring during the etching process.

Meanwhile, in the present example embodiment, a cross-section of the sealing member 160 has a rectangular shape, but the cross-sectional shape of the sealing member 160 may have a shape corresponding to a shape of the insertion groove 122*b* formed in the electrostatic chuck 122. That is, the cross-sectional shape of the sealing member 160 may be variously changed.

A pressure adjusting unit 170 (see. FIG. 1) serves to adjust a pressure of cooling gas supplied from an outside to provide it to the focus ring 123. To this end, the pressure adjusting unit 170 may be connected to a control unit (not shown). That is, the control unit controls the pressure adjusting unit 170 so that the cooling gas is provided to the focus ring 123 at an appropriate pressure according to the process conditions. In addition, the pressure adjusting unit 170 may be connected to the process chamber 110 (see FIG. 1) through a supply pipe 172 (see FIG. 1).

As described above, since the sealing member 160 has a porous material having voids formed only therein, it is possible to prevent the discharge from occurring during the etching process. Furthermore, since the Shore A hardness of the sealing member 160 has a value of 15 to 50, discharge occurrence may be further suppressed.

Figure 4:
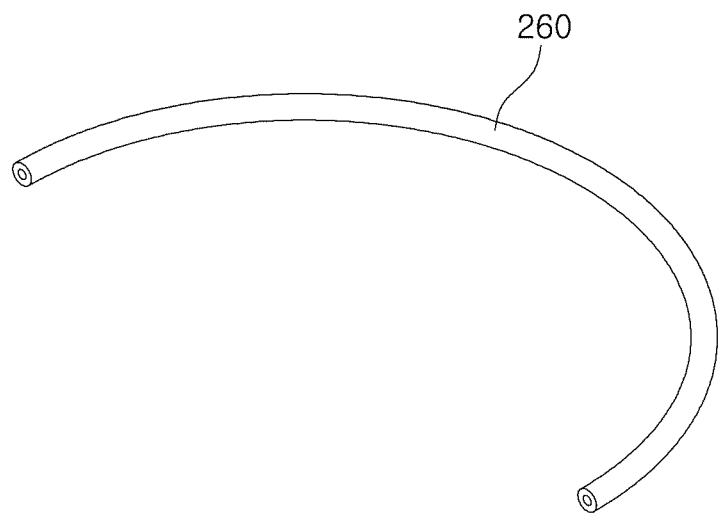
FIG. 4 is a cutaway perspective view illustrating modified example embodiments of the sealing member.

FIG. 4 is a partial perspective view illustrating modified example embodiments of the sealing member.

Referring to FIG. 4, a sealing member 260 may have a circular ring shape, and may have a hollow tubular shape or cross-section. Meanwhile, the sealing member 260 may have a value of Shore A hardness of 15 to 50. The sealing member 260 may have a filling rate or fill amount of 90% or more in an insertion groove provided in the electrostatic chuck 122 (see FIG. 2).

Figure 5:
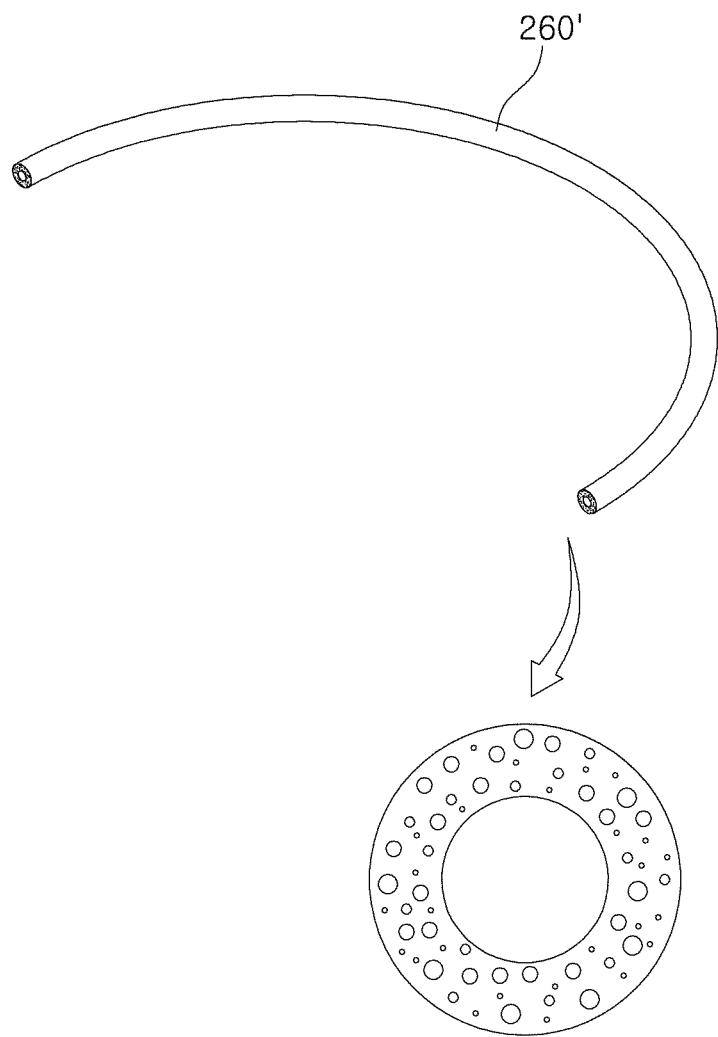
FIG. 5 is a cutaway perspective view illustrating other modified example embodiments of the sealing member.

FIG. 5 is a partial perspective view illustrating modified example embodiments of the sealing member.

Referring to FIG. 5, a sealing member 260' may have a circular ring shape, and may have a hollow tubular shape or cross-section. Meanwhile, the sealing member 260' may have a value of Shore A hardness of 15 to 50. The sealing member 260' may have a filling rate or fill amount of 90% or more in an insertion groove provided in the electrostatic chuck 122 (see FIG. 2).

Meanwhile, the sealing member 260' may have voids formed only therein as an example. In other words, the sealing member 260' may be formed of a porous material, but voids are not formed or present on outer and inner surfaces of the sealing member 260'. That is, the outer and inner surfaces of the sealing member 260' may be formed to be smooth. For example, the sealing member 260' may include an outer surface, and inner surface, and a body portion between the outer surface and the inner surface, and only the body portion may include voids and the outer surface and inner surface may each be smooth and free of voids.

Figure 6:
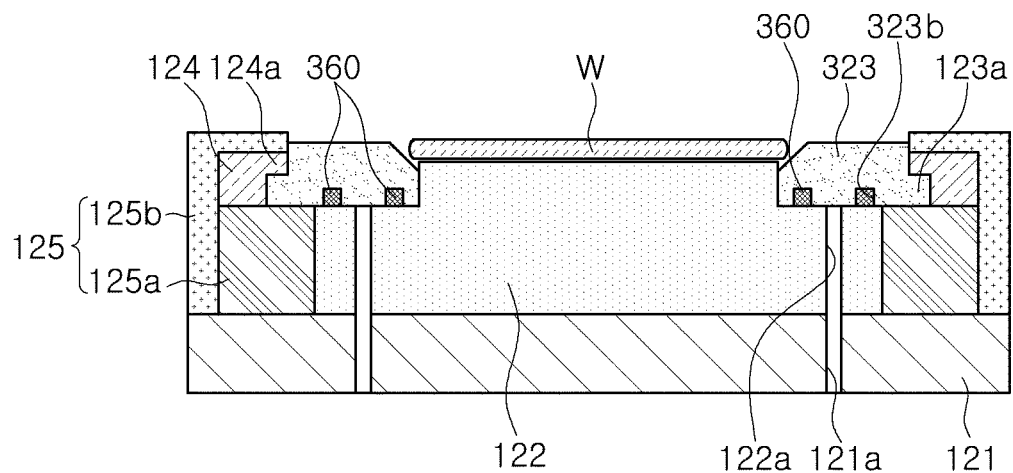
FIG. 6 is a configuration diagram illustrating a region corresponding to FIG. 2 of an etching apparatus according to example embodiments.

FIG. 6 is a configuration diagram illustrating a region corresponding to FIG. 2 of an etching apparatus according to example embodiments.

Referring to FIG. 6, a sealing member 360 is insertedly disposed in an insertion groove 323*b* of a focus ring 323. Meanwhile, the insertion groove 323*b* may have a rectangular cross-section, and the sealing member 360 may have a shape corresponding to the insertion groove 323*b*. The insertion groove 323*b* may have a circular ring shape, and two insertion grooves 323*b* may be spaced apart and disposed in a radial direction. The second flow path 122*a* of the electrostatic chuck 122 may be open toward or at the focus ring 323 between the two insertion grooves 323*b*.

Meanwhile, since the insertion groove 323*b* in which the sealing member 360 is installed is provided in the focus ring 323, a surface of the electrostatic chuck 323 disposed opposite to the focus ring 323 may be formed to be flat.

The sealing member 360 may have voids formed only therein. In other words, the sealing member 360 may be formed of a porous material, but no voids are formed in or on an outer surface of the sealing member 360. That is, the outer surface of the sealing member 360 may be formed to be smooth. For example, the sealing member 360 may include a body portion and an outer surface surrounding the body portion, and only the body portion may include voids and the outer surface may be smooth and free of voids. The sealing member 360 may have a value of Shore A hardness of 15 to 50.

Meanwhile, since the fixing chuck 121, the fixing ring 124, and the insulating ring 125 of the susceptor 120 are substantially the same as the above-described components, a detailed description thereof will be omitted and the description is replaced with the above description.

Figure 7:
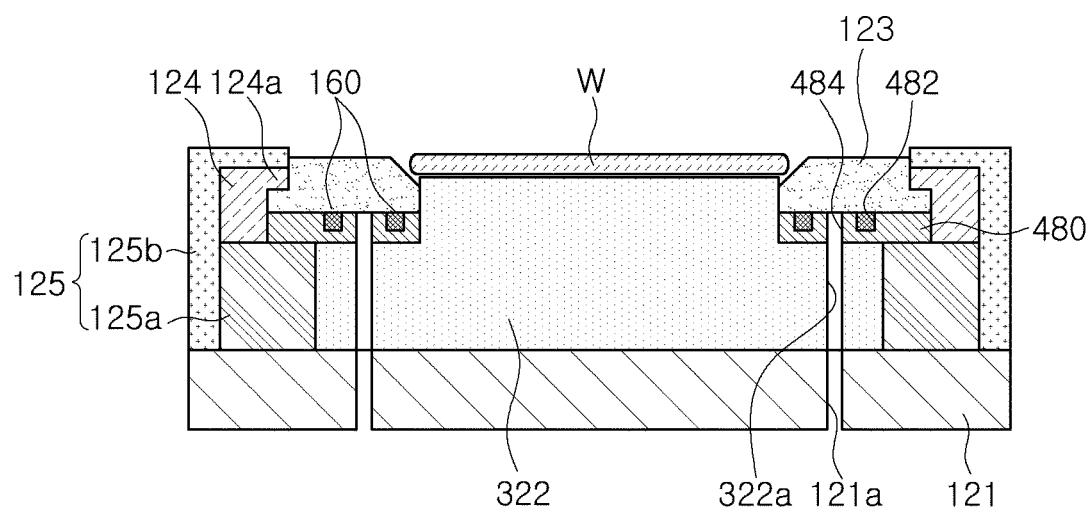
FIG. 7 is a configuration diagram illustrating a region corresponding to FIG. 2 of the etching apparatus according to example embodiments.

FIG. 7 is a configuration diagram illustrating a region corresponding to FIG. 2 of an etching apparatus according to example embodiments.

Referring to FIG. 7, a focus ring 123 may be installed on an installation member 480. The installation member 480 may be fixedly installed in or on the electrostatic chuck 322. Meanwhile, the installation member 480 may be provided with an insertion groove 482 into which the sealing member 160 is insertedly disposed. The installation member 480 may be provided with a third flow path 484 connected to the second flow path 322a. In other words, the sealing member 160 may be installed in the installation member 480 disposed between the electrostatic chuck 322 and the focus ring 160. To this end, the installation member 480 may be provided with the insertion groove 482.

Meanwhile, since the fixing chuck 121, the focus ring 123, the fixing ring 124, the insulating ring 125, and the sealing member 160 of the susceptor 120 are substantially the same as the components described above, a detailed description thereof will be omitted and the description is replaced with the above description.

Figure 8:
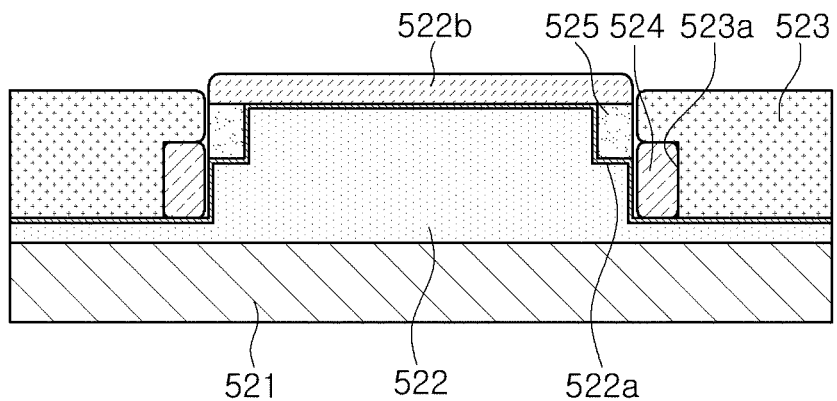
FIG. 8 is a configuration diagram illustrating a region corresponding to FIG. 2 of the etching apparatus according to example embodiments.

FIG. 8 is a configuration diagram illustrating a region corresponding to FIG. 2 of an etching apparatus according to example embodiments.

Referring to FIG. 8, an electrostatic chuck 522 is installed on an upper surface of a fixing chuck 521. Meanwhile, the fixing chuck 521 may be formed of a conductive material having excellent electrical conductivity such as aluminum (Al), and may have a disk shape having a diameter larger than that of the electrostatic chuck 522.

The electrostatic chuck 522 is fixedly installed on an upper surface of the fixing chuck 521. Meanwhile, a side surface of the electrostatic chuck 522 may be formed to be stepped. Meanwhile, a coating layer 522a may be formed on an outer surface of the electrostatic chuck 522. For example, the coating layer 522a may be formed of an aluminum oxide ($Al_2O_3$) material. In addition, the electrostatic chuck 522 may be provided with a plate portion 522b having a circular plate shape. For example, the plate portion 522b may be a formed of an aluminum oxide ($Al_2O_3$) material. The plate portion 522b may be disposed to cover the upper surface of the electrostatic chuck 522.

A focus ring 523 may be fixedly installed to the electrostatic chuck 522 to surround an upper end portion or upper outer portion of the electrostatic chuck 522. For example, the focus ring 523 may have a circular ring shape. In addition, the focus ring 523 may be formed of a conductive material such as a metal. Meanwhile, the focus ring 523 serves to improve uniformity of plasma sheath formed on a wafer by moving active ions or radicals of source plasma to a periphery region of the wafer. Accordingly, the source plasma formed in the inner space of the process chamber 110 (see FIG. 1) may be intensively formed in an upper region of the wafer.

Meanwhile, the focus ring 523 may be formed of any one of silicon (Si), silicon carbide (SiC), silicon oxide ($SiO_2$), and aluminum oxide ($Al_2O_3$).

In addition, a groove portion 523a may be formed on the inner surface of the focus ring 523 in which a ring member 524 is installed to prevent a discharge from occurring.

The ring member 524 is fixedly installed to the groove portion 523a of the focus ring 523. Meanwhile, the ring member 524 may serve to prevent discharge from occurring in a round portion of the electrostatic chuck 522. For example, the ring member 524 may be formed of an aluminum oxide ($Al_2O_3$) material. Meanwhile, an inner surface of the ring member 524 and an opposing outer or side surface of the electrostatic chuck 522 are spaced apart and disposed at a predetermined interval or distance from each other.

With regard thereto, in more detail, since the side surface of the electrostatic chuck 522 is formed to be stepped, the thickness of the coating layer 522a may be unevenly formed when the coating layer 522a is stacked or applied. That is, the thickness of the coating layer 522a may be unevenly formed in a region formed roundly on the side surface of the electrostatic chuck 522 that is formed to be stepped.

However, when the ring member 524 is not installed and the inner surface of the focus ring 523 is disposed opposite to the electrostatic chuck 522, discharge occurs in a region formed roundly on the side surface of the electrostatic chuck 522. The discharge occurs in a roundly formed region of the electrostatic chuck 522 having a thin thickness of the coating layer 522a while a potential difference between the electrostatic chuck 522 and the focus ring 523 becomes approximately 220V.

However, when the ring member 524 is installed in a region roundly formed on the side surface of the electrostatic chuck 522, the potential difference between the electrostatic chuck 522 and the ring member 524 is lowered to about 70V. Accordingly, it is possible to prevent a discharge from occurring in the region formed roundly on the side surface of the electrostatic chuck 521.

A support member 525 is fixedly installed in a stepped portion of the electrostatic chuck 521 to serve to support an edge of the plate portion 522b of the electrostatic chuck 522. The support member 525 may have a ring shape.

As described above, since the ring member 524 is installed on the inner surface of the focus ring 523, it is possible to prevent the occurrence of discharge in a region formed roundly on the side surface of the electrostatic chuck 522.

Figure 9:
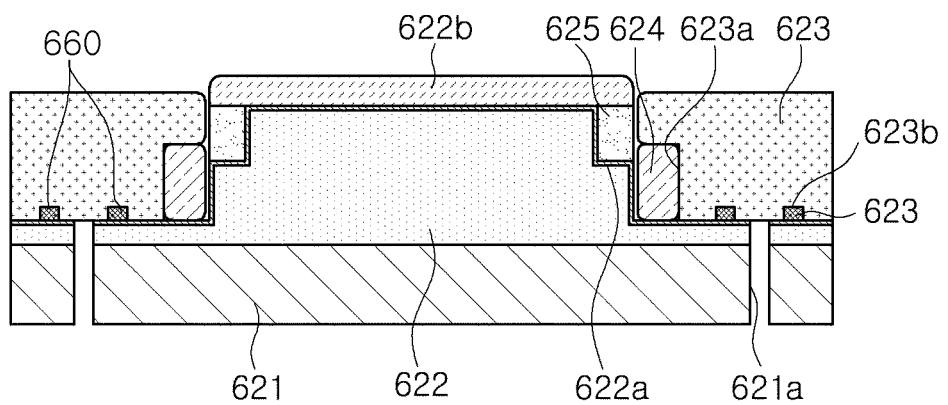
FIG. 9 is a configuration diagram illustrating a region corresponding to FIG. 2 of the etching apparatus according to example embodiments.

FIG. 9 is a configuration diagram illustrating a region corresponding to FIG. 2 of an etching apparatus according to example embodiments.

Referring to FIG. 9, an electrostatic chuck 622 is installed on an upper surface of a fixing chuck 621. Meanwhile, the fixing chuck 621 may be formed of a conductive material having excellent electrical conductivity such as aluminum (Al), and may have a disk shape having a diameter larger than that of the electrostatic chuck 622.

The electrostatic chuck 622 is fixedly installed on an upper surface of the fixing chuck 621 as described above. Meanwhile, the side surface of the electrostatic chuck 622 may be formed to be stepped. Meanwhile, a coating layer 622a may be formed on an outer surface of the electrostatic chuck 622. For example, the coating layer 622a may be formed of an aluminum oxide ($Al_2O_3$) material. In addition, the electrostatic chuck 622 may be provided with a plate portion 622b having a circular plate shape. For example, the plate portion 622b may be formed of an aluminum oxide (Al₂O₃) material. The plate portion 622b may be disposed to cover the upper surface of the electrostatic chuck 622.

A focus ring 623 is fixedly installed to the electrostatic chuck 622 to surround an upper end portion of the electrostatic chuck 622. For example, the focus ring 623 may have a circular ring shape. In addition, the focus ring 623 may be formed of a conductive material such as a metal. Meanwhile, the focus ring 623 serves to improve uniformity of plasma sheath formed on a wafer by moving active ions or radicals of source plasma to a periphery portion of the wafer. Accordingly, the source plasma formed in the inner space of the process chamber (see FIG. 1) may be concentrically formed in an upper region of the wafer.

Meanwhile, the focus ring 623 may be formed of any one of silicon (Si), silicon carbide (SiC), silicon oxide ($SiO_2$), and aluminum oxide ($Al_2O_3$).

In addition, a groove portion 623a may be formed on the inner surface of the focus ring 623 in which a ring member 624 is installed to prevent a discharge from occurring.

A bottom surface of the focus ring 623 may be provided with an insertion groove 623b into which a sealing member 660 is insertedly installed. The insertion groove 623b may have a circular ring shape, and two insertion grooves 623b may be spaced apart and disposed in a radial direction. A cooling path 621a of the fixing chuck 621 may be open toward or at the focus ring 623 between the two insertion grooves 623b.

A ring member 624 is fixedly installed in the groove portion 623a of the focus ring 623. Meanwhile, the ring member 624 may serve to prevent discharge from occurring in a region formed roundly on the side surface of the electrostatic chuck 622 and in the vicinity thereof. The ring member 624 may be formed of, for example, an aluminum oxide ($Al_2O_3$) material. Meanwhile, an inner surface of the ring member 624 and an opposing surface of the electrostatic chuck 622 are spaced apart by a predetermined interval or distance.

With regard thereto, in more detail, since a side surface of the electrostatic chuck 622 is formed to be stepped, a thickness of the coating layer 622a may be uneven when the coating layer 622a is stacked or applied. That is, the thickness of the coating layer 622a may be uneven in a region formed roundly on the side surface of the electrostatic chuck 622 which is formed to be stepped and in the vicinity thereof.

However, when the ring member 624 is not installed and the inner surface of the focus ring 623 is disposed opposite to the electrostatic chuck 622, discharge occurs in a region formed roundly on the side surface of the electrostatic chuck 622 and in a vicinity thereof. The discharge occurs in the region formed roundly of the electrostatic chuck 622 in which the thickness of the coating layer 622a is formed thin while the potential difference between the electrostatic chuck 622 and the focus ring 623 becomes approximately 220V.

However, when the ring member 624 is installed in the focus ring 623 so as to face the region formed roundly on the side surface of the electrostatic chuck 622, the potential difference between the electrostatic chuck 622 and the ring member 624 is lowered to become approximately 70V. Accordingly, it is possible to prevent the discharge from occurring in the region formed roundly on the side surface of the electrostatic chuck 622 and in the vicinity thereof. For example, the stepped side surface of the electrostatic chuck 622 may include a lower vertical portion, a horizontal portion, and an upper vertical portion. The region formed roundly may be or include the lower vertical portion of the stepped side surface of the electrostatic chuck 622.

A support member 625 is fixedly installed to a stepped portion of the electrostatic chuck 621 to serve to support an edge of the plate portion 622b of the electrostatic chuck 622. The support member 625 may have a ring shape.

The sealing member 660 is insertedly disposed into an insertion groove 623b of the focus ring 623. The sealing member 660 serves to prevent cooling gas provided to the focus ring 623 from entering an internal space of a vacuum chamber 110 (see FIG. 1). Meanwhile, the sealing member 660 may be provided with voids formed only therein. In other words, the sealing member 660 may be formed of a porous material, but no gap may be formed in an outer surface of the sealing member 660. That is, the outer surface of the sealing member 660 may be formed to be smooth. For example, the sealing member 660 may include a body portion and an outer surface surrounding the body portion, and only the body portion may include voids and the outer surface may be smooth and free of voids. In addition, the sealing member 660 may have a value of Shore A hardness of 15 to 50.

As described above, since the sealing member 660 is formed of a porous material having voids formed only therein, has a value of Shore A hardness of 15 to 50, the sealing member 660 may be suppressed from being deformed even if the temperature of the focus ring 623 is increased. Therefore, since the gap between the focus ring 623 and the fixing chuck 621 may not be generated by the deformation of the sealing member 660, the etching process may be easily performed.

Meanwhile, the sealing member 660 may have a filling rate or fill amount of 90% or more in the insertion groove 623b (e.g., the sealing member 660 may fill 90% or more of a volume of the insertion groove 623b).

As set forth above, it is possible to provide an etching apparatus that can prevent a gap of a space between an O-ring and a focus ring or a fixing chuck.

In addition, it is possible to provide an etching apparatus that can prevent discharge from occuring.

While example embodiments have been illustrated and described above, it will be apparent to those skilled in the art that modifications and variations could be made without departing from the scope of the present inventive concept as defined by the appended claims.

What is claimed is:

1. An etching apparatus, comprising:
   a reaction chamber having an internal space;
   an upper electrode in the reaction chamber;
   a fixing chuck formed of a conductive material in the internal space of the reaction chamber and below the upper electrode;
   an electrostatic chuck above the fixing chuck and on which a wafer is configured to be placed;
   a focus ring surrounding the electrostatic chuck; and
   a plurality of sealing members configured to seal cooling gas provided to the focus ring and being in contact with the focus ring,
   wherein the plurality of sealing members are formed of a porous material, each of the plurality of sealing members comprises a body portion and an outer surface surrounding the body portion, and only the body portion includes voids and the outer surface is smooth and free of voids,
   wherein the fixing chuck comprises a first flow path through which the cooling gas is configured to flow, and the electrostatic chuck comprises a second flow path connected to the first flow path and configured to provide the cooling gas to the focus ring.

2. The etching apparatus of claim 1, wherein each of the plurality of sealing members has a value of Shore A hardness of 15 to 50.

3. The etching apparatus of claim 1, wherein the plurality of sealing members are inserted into a plurality of insertion grooves in the electrostatic chuck or the focus ring.

4. The etching apparatus of claim 3, wherein each of the plurality of sealing members fills 90% or more of a corresponding one of the plurality of insertion grooves.

5. The etching apparatus of claim 3, wherein the plurality of insertion grooves are spaced apart in a radial direction.

6. The etching apparatus of claim 3, wherein the first flow path and the second flow path are configured to provide the cooling gas between the plurality of insertion grooves.

7. The etching apparatus of claim 1, wherein each of the plurality of sealing members has a circular ring shape, and a cross-section thereof has a rectangular shape.

8. The etching apparatus of claim 1, further comprising an installation member between the electrostatic chuck and the focus ring and comprising a plurality of insertion grooves into which the plurality of sealing members are inserted.

9. The etching apparatus of claim 8, wherein the plurality of insertion grooves are spaced apart in a radial direction, and
the installation member comprises a third flow path connected to the second flow path and configured to provide the cooling gas between the plurality of insertion grooves.

10. The etching apparatus of claim 1, further comprising a fixing ring surrounding the focus ring and configured to fix the focus ring.

11. The etching apparatus of claim 10, further comprising an insulating ring configured to insulate the electrostatic chuck and the fixing ring.

12. An etching apparatus, comprising:
a reaction chamber having an internal space;
an upper electrode in the reaction chamber;
a fixing chuck formed of a conductive material in the internal space of the reaction chamber and below the upper electrode;
an electrostatic chuck above the fixing chuck and on which a wafer is configured to be placed; and
a focus ring surrounding the electrostatic chuck,
wherein the electrostatic chuck comprises a stepped side surface, and a coating layer is on an outer surface of the electrostatic chuck,
the focus ring comprises a groove portion such that an inner side surface of the focus ring is stepped, the groove portion opposite the side surface of the electrostatic chuck, and
the etching apparatus further comprises a ring member in the groove portion.

13. The etching apparatus of claim 12, wherein the coating layer and the ring member are formed of the same material.

14. The etching apparatus of claim 12, wherein a portion of the side surface of the electrostatic chuck opposite an inner surface of the ring member and the inner surface of the ring member are spaced apart from one another.

15. The etching apparatus of claim 12, wherein the electrostatic chuck is formed of a conductive material.

16. An etching apparatus, comprising:
a reaction chamber having an internal space;
an upper electrode in the reaction chamber;
a fixing chuck formed of a conductive material in the internal space of the reaction chamber and below the upper electrode;
an electrostatic chuck above the fixing chuck and on which a wafer is configured to be placed;
a focus ring surrounding the electrostatic chuck, and comprising a groove portion in a lower portion of an inner side surface thereof and an insertion groove on a bottom surface thereof;
a ring member fixedly installed in the groove portion of the focus ring; and
a sealing member received in the insertion groove,
wherein the sealing member is formed of a porous material and comprises a body portion and an outer surface surrounding the body portion, and only the body portion includes voids and the outer surface is smooth and free of voids.

17. The etching apparatus of claim 16, wherein the sealing member has a value of Shore A hardness of 15 to 50.

18. The etching apparatus of claim 16, wherein the sealing member fills 90% or more of a volume of the insertion groove.

19. The etching apparatus of claim 16, wherein the insertion groove comprises a plurality of insertion grooves that are spaced apart in a radial direction.

20. The etching apparatus of claim 16, wherein a side surface of the electrostatic chuck is stepped, a coating layer is on an outer surface of the electrostatic chuck, and the ring member is opposite the side surface of the electrostatic chuck.

* * * * *